United States Patent
Yokoyama

(10) Patent No.: US 10,535,661 B2
(45) Date of Patent: Jan. 14, 2020

(54) INTEGRATED MEMORY AND INTEGRATED ASSEMBLIES

(71) Applicant: Micron Technology, Inc., Boise, ID (US)

(72) Inventor: Yuichi Yokoyama, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/429,486

(22) Filed: Jun. 3, 2019

(65) Prior Publication Data

US 2019/0348417 A1    Nov. 14, 2019

Related U.S. Application Data

(63) Continuation of application No. 15/965,717, filed on Apr. 27, 2018, now Pat. No. 10,312,241.

(51) Int. Cl.
| | |
|---|---|
| *H01L 27/10* | (2006.01) |
| *H01L 27/108* | (2006.01) |
| *H01L 27/02* | (2006.01) |
| *H01L 27/06* | (2006.01) |
| *H01L 49/02* | (2006.01) |

(52) U.S. Cl.
CPC .... *H01L 27/10805* (2013.01); *H01L 27/0207* (2013.01); *H01L 27/0605* (2013.01); *H01L 28/40* (2013.01)

(58) Field of Classification Search
CPC .......... H01L 27/10805; H01L 27/0605; H01L 27/0207; H01L 28/40
See application file for complete search history.

(56) References Cited

U.S. PATENT DOCUMENTS

| | | | |
|---|---|---|---|
| 7,939,877 B2 * | 5/2011 | Kennedy | ........... H01L 27/10814 257/306 |
| 10,177,152 B1 * | 1/2019 | Sandhu | ............. H01L 27/10817 |
| 2016/0013191 A1 | 1/2016 | Sapra et al. | |

* cited by examiner

*Primary Examiner* — Mohammed A Bashar
(74) *Attorney, Agent, or Firm* — Wells St. John P.S.

(57) ABSTRACT

Some embodiments include an integrated assembly having a capacitor. The capacitor has a storage node configured as an upwardly-opening container shape. The container shape has a first side surface and a second side surface. The first and second side surfaces are along outer edges of the container shape and are in opposing relation to one another. The second side surface has a lower portion vertically overlapped by the first side surface, and has an upper portion which is not vertically overlapped by the first side surface. A middle-level lattice is adjacent to the first side surface and supports the first side surface. A higher-level lattice is adjacent to the second side surface and supports the second side surface. Some embodiments include integrated memory (e.g., DRAM).

15 Claims, 12 Drawing Sheets

INTEGRATED MEMORY AND INTEGRATED ASSEMBLIES

RELATED PATENT DATA

This patent resulted from a continuation of U.S. patent application Ser. No. 15/965,717, filed on Apr. 27, 2018, now issued as U.S. Pat. No. 10,312,241, each of which is hereby incorporated by reference herein.

TECHNICAL FIELD

Integrated memory (e.g., DRAM), and integrated assemblies.

BACKGROUND

It is desired to form integrated circuitry to ever-higher levels of integration. Capacitors are commonly utilized in integrated circuitry, and it is desired to shrink capacitors to ever-tighter lateral dimensions in order to conserve valuable semiconductor real estate.

One type of capacitor is a so-called container device. A storage electrode (i.e., storage node) of such device is shaped as a container. Dielectric material and another capacitor electrode (i.e., plate electrode) may be formed within the container and along an outer edge of the container, which can form a capacitor having high capacitance and a small footprint.

Container-shaped storage nodes are becoming increasingly taller and narrower (i.e., are being formed to higher aspect ratios) in an effort to achieve desired levels of capacitance while decreasing the amount of semiconductor real estate consumed by individual capacitors. Unfortunately, high-aspect-ratio storage nodes can be structurally weak; and subject to toppling, twisting and/or breaking from an underlying base.

Lattice methodology has been developed to avoiding toppling of high-aspect-ratio containers. In such methodology, a lattice is provided to hold container-shaped electrodes from toppling.

Example prior art lattice methodology is described with reference to FIGS. 1-5.

Referring to FIG. 1, a prior art assembly 10 is shown to comprise a pair of adjacent storage nodes 12a and 12b. Each of the storage nodes comprises conductive material 14 configured in an upwardly-opening container shape. Each of the container-shaped storage nodes 12a and 12b has a first side surface 15 and a second side surface 17; with the second side surface 17 being taller than the first side surface 15.

Lattices 18, 20 and 22 are along the second side surfaces 17 of the container-shaped storage nodes 12a and 12b. The lattices comprise lattice material 16 (e.g., silicon nitride).

The lattices 18, 20 and 22 may be referred to as a lower-level lattice, a mid-level lattice and a higher-level lattice, respectively.

The lower-level lattice 18 is supported by an underlying material 24 (e.g., silicon dioxide). Conductive interconnects 26a and 26b extend through the material 24 to connect with the storage nodes 12a and 12b, respectively. The material 24 and the interconnects 26a and 26b may be considered to form a supporting base for the storage nodes 12a and 12b.

The interconnects 26a and 26b couple the storage nodes 12a and 12b with transistors 28a and 28b, respectively. Each of the transistors 28a and 28b comprises a pair of source/drain regions. One of the source/drain regions of the transistor 28a is coupled with the interconnect 26a and the other is coupled with a bitline BL(a); and one of the source/drain regions of the transistor 28b is coupled with the interconnect 26b and the other is coupled with a bitline BL(b). Each of the transistors 28a and 28b comprises a gate which is coupled with a wordline. The gate of the transistor 28a is coupled with a wordline WL(a), and the gate of the transistor 28b is coupled with a wordline WL(b).

The storage nodes 12a, 12b and the associated transistors 28a, 28b may be incorporated into a memory array (with an example memory array being discussed below with reference to FIG. 4). In such embodiments, the neighboring storage nodes 12a and 12b may both be coupled with a common bitline (i.e., BL(a) and BL(b) may be the same bitline) if the neighboring storage nodes are along a same column as one another, or may both be coupled with a common wordline (i.e., WL(a) and WL(b) may be the same wordline) if the neighboring storage nodes are along a same row as one another.

The various structures of FIG. 1 may be supported by an underlying semiconductor substrate (not shown). The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, a semiconductor substrate.

One aspect of the prior art configuration of FIG. 1 is that the higher-level lattice 22 is patterned identically to the middle-level lattice 20. FIGS. 2A and 2B diagrammatically illustrate such patterning.

FIGS. 2A and 2B show a plurality of storage nodes 12 arranged in a hexagonally-packed pattern. The higher-level lattices 22 are shown in FIG. 2A, and the middle-level lattices 20 are shown in FIG. 2B. One of the higher-level lattices 22 of FIG. 2A is labeled as a lattice 22a so that it may be specifically identified, and is surrounded with a box 30; and one of the middle-levels lattices 20 of FIG. 2B is labeled as a lattice 20a so that it may be specifically identified, and is surrounded with the box 32. The higher-level lattice 22a is associated with the same storage nodes 12 as the middle-level lattice 20a, and is directly over the middle-level lattice 20a.

The storage nodes 12a and 12b may be incorporated into capacitors, as shown in FIG. 3. Specifically, capacitor dielectric material 34 is provided along outer surfaces of the storage nodes 12a and 12b; and capacitor electrode material 36 is provided over the capacitor dielectric material 34. The storage node 12a, together with the capacitor dielectric material 34 and the capacitor electrode material 36, forms a first capacitor 38a; and the storage node 12b, together with the capacitor dielectric material 34 and the capacitor electrode material 36, forms a second capacitor 38b.

The capacitor electrode material 36 may be considered to form a plate electrode that extends across the capacitors 38a and 38b. The plate electrode is coupled with a reference voltage 40, which may be referred to as a common plate (CP) voltage. The CP voltage may be any suitable voltage, such as a voltage within a range of from greater than or equal to ground to less than or equal to VCC (i.e., ground-≤CP≤VCC).

The capacitors 38a and 38b of FIG. 3 may be incorporated into a memory array. FIG. 4 schematically illustrates a prior art DRAM (dynamic random-access memory) array 42. The array includes a plurality of memory cells 44; with each memory cell including a transistor 28 and a capacitor 38.

Wordlines (WL1, WL2 and WL3) extend along rows of the memory array, and bitlines (BL1, BL2 and BL3) extend along columns of the memory array. Each of the memory cells 44 is uniquely addressed through a combination of one of the wordlines with one of the bitlines.

The storage nodes 12a and 12b are shown in a desired configuration in FIG. 1; and the capacitors 38a and 38b are shown in a desired configuration in FIG. 3. However, a problem associated with the prior art configuration of FIG. 1 is that the storage nodes may shift from the desired configuration. FIG. 5 diagrammatically illustrates problematic shifting of the storage nodes, with solid lines indicating desired configurations of the storage nodes and dashed lines indicating shifted locations of the storage nodes. The lattices 18, 20 and 22 have failed to fully secure the storage nodes 12a and 12b; and accordingly the storage nodes may twist, bend, sway, etc., and thereby shift from the desired configuration. Arrows 46 are provided in FIG. 5 to emphasize the shifting of the storage node locations. The stresses along the various regions of the storage nodes 12a and 12b may be related to stresses of tall pillars, and in some cases may be described utilizing Euler's formula.

The shifting of the storage nodes 12a and 12b may detrimentally impact structural stability of the storage nodes, and may detrimentally impact structural stability of capacitors formed from such storage nodes. Such may lead to non-uniform performance across an array of capacitors, and may even result in inoperable devices.

It would be desirable to develop architectures which alleviate the problems described with reference to FIG. 5.

DETAILED DESCRIPTION OF THE ILLUSTRATED EMBODIMENTS

Some embodiments include integrated assemblies having container-shaped capacitor storage nodes supported by lattices. An upper-level lattice supports upper portions of the storage nodes, and a middle-level lattice supports middle portions of the storage nodes. The middle-level lattice has a different pattern then the upper-level lattice. Example embodiments are described with reference to FIGS. 6-11.

Figure 6:
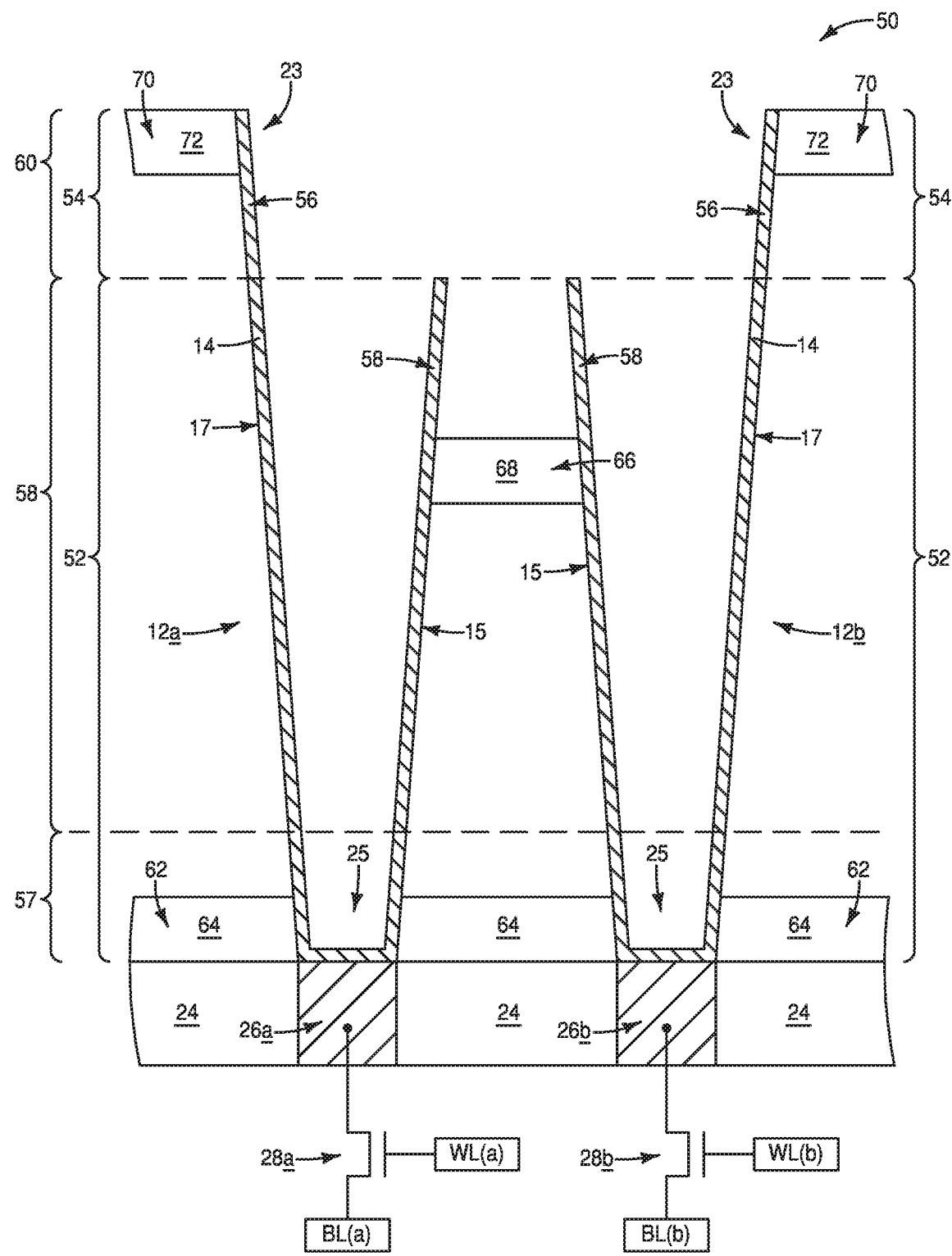
FIG. 6 is a diagrammatic cross-sectional side view of an example assembly having a pair of neighboring capacitor storage nodes.

Referring to FIG. 6, an integrated assembly 50 includes capacitor storage nodes 12a and 12b of the type described above with reference to FIG. 1. The capacitor storage nodes comprise the conductive material 14. Such conductive material may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 14 may comprise titanium nitride.

The storage nodes 12a and 12b are configured as upwardly-opening container shapes along the cross-section of FIG. 6. Each of the container shapes has a first side surface 15 and a second side surface 17. The first and second side surfaces 15 and 17 are along outer edges of the container shapes, and are in opposing relation to one another. The first and second side surfaces 15 and 17 may be alternatively referred to as first and second edges, respectively.

In some embodiments, the container-shaped storage nodes 12a and 12b may be considered to be cylindrically shaped. The storage nodes 12a and 12b may be considered to be generally representative of a group of substantially identical storage nodes that may be referred to as storage nodes 12; with the term "substantially identical" meaning identical to within reasonable tolerances of fabrication and measurement.

The second side surfaces 17 have lower portions 52 which are vertically-overlapped by the first side surfaces 15, and have upper portions 54 which are not vertically overlapped by the first side surfaces.

In some embodiments, the neighboring storage nodes 12a and 12b may be considered together to have a configuration along the cross-section of FIG. 6 which includes an outer pair of sidewalls 56 and an inner pair of sidewalls 58. The sidewalls 56 may be referred to as outer sidewalls, and the sidewalls 58 may be referred to as inner sidewalls. The second side surfaces 17 are along edges of the outer sidewalls 56, and the first side surfaces 15 are along edges of the inner sidewalls 58. The inner pair of sidewalls 58 is shorter than the outer pair of sidewalls 56; or in other words, the inner pair of sidewalls 58 has upper surfaces which are recessed relative to upper surfaces of the outer pair of sidewalls 56.

Each of the storage nodes 12a and 12b has an upper portion (i.e., top portion) 23 along an outer sidewall 56. Each of the storage nodes 12a and 12b also has a lower portion (i.e., bottom portion) 25 comprising a bottom of the container shape.

Various elevational levels (i.e. regions) may be defined along the storage nodes 12a and 12b. For instance, a first (or lower) level 57 may be defined to extend along lower regions of the first and second storage nodes 12a and 12b; a third (or upper) level 60 may be defined to extend along the upper regions of the first and second storage nodes 12a and 12b; and a second (or middle) level 58 may be defined to extend between the first and third levels.

A lower-level lattice 62 is within the first level 57, and is along the lower portions 25 of the storage nodes 12a and 12b. In the shown embodiment, the lower-level lattice 62 directly contacts the second side surfaces 17 of the storage nodes 12a and 12b.

The lower-level lattice 62 comprises a lattice material 64. The lattice material 64 may comprise any suitable composition(s); and in some embodiments may comprise, consist essentially of, or consist of silicon nitride.

A middle-level lattice 66 is within the second level 58. The middle-level lattice 66 is between the inner sidewalls 58, and is adjacent to the first side surfaces 15. The middle-level lattice 66 supports the first side surfaces 15 of the storage nodes. In the shown embodiment, the middle-level lattice directly contacts the first side surfaces 15.

The middle-level lattice 66 comprises a lattice material 68. The lattice material 68 may comprise any suitable composition(s); and in some embodiments may comprise, consist essentially of, or consist of silicon nitride.

An upper-level (or higher-level) lattice 70 is within the third level 60, and is along outer peripheries of the outer sidewalls 56. The upper-level lattice 70 is adjacent to the second side surfaces 17 of the storage nodes 12a and 12b; and supports the second side surfaces of the storage nodes. In the shown embodiment, the upper-level lattice 70 directly contacts the second side surfaces 17.

The upper-level lattice 70 comprises a lattice material 72. The lattice material 72 may comprise any suitable composition(s); and in some embodiments may comprise, consist essentially of, or consist of silicon nitride.

In some embodiments, the lattice materials 64, 68 and 72 may be referred to as insulative materials. The insulative materials 64, 68 and 72 may be referred to as first, second and third insulative materials, respectively, to distinguish them from one another. Alternatively, in some embodiments the lower level lattice 62 may be an optional lattice, and the materials 68 and 72 of the middle-level and upper-level lattices may be referred to as first and second insulative materials, respectively.

The insulative materials 64, 68 and 72 may be the same composition as one another in some embodiments (i.e., may all comprise silicon nitride). In other embodiments, at least one of the insulative materials 64, 68 and 72 may comprise a different composition relative to another of the insulative materials 64, 68 and 72.

The upper-level lattice 70 is above the middle-level lattice 66. The upper-level lattice 70 and the middle-level lattice 66 may be placed in any suitable locations relative to the storage nodes 12a and 12b. In the shown embodiment, the upper-level lattice 70 is along the upper portions 54 of the storage nodes 12a and 12b (i.e., is along portions of the outer sidewalls 56 which are not vertically overlapped by the inner sidewalls 58); and is along top surfaces of the storage nodes 12a and 12b (i.e., is along the tops of the storage nodes 12a and 12b). In other embodiments, the upper-level lattice 70 may be in another location relative to the storage nodes 12a and 12b.

The embodiment of FIG. 6 shows the storage nodes 12a and 12b supported by three lattice levels (62, 66 and 70). In other embodiments, the storage nodes may be supported by a different number of lattice levels. For instance, the lattice level 70 may be representative of multiple lattice levels formed along the edges 17 of the outer sidewalls 56, and above the bottoms of the storage nodes 12a and 12b. Additionally, or alternatively, the lattice level 66 may be representative of multiple lattice levels formed along the edges 15 of the inner sidewalls 58. Additionally, or alternatively, the lattice level 62 along the bottoms of the storage nodes 12a and 12b may be omitted.

Figure 1:
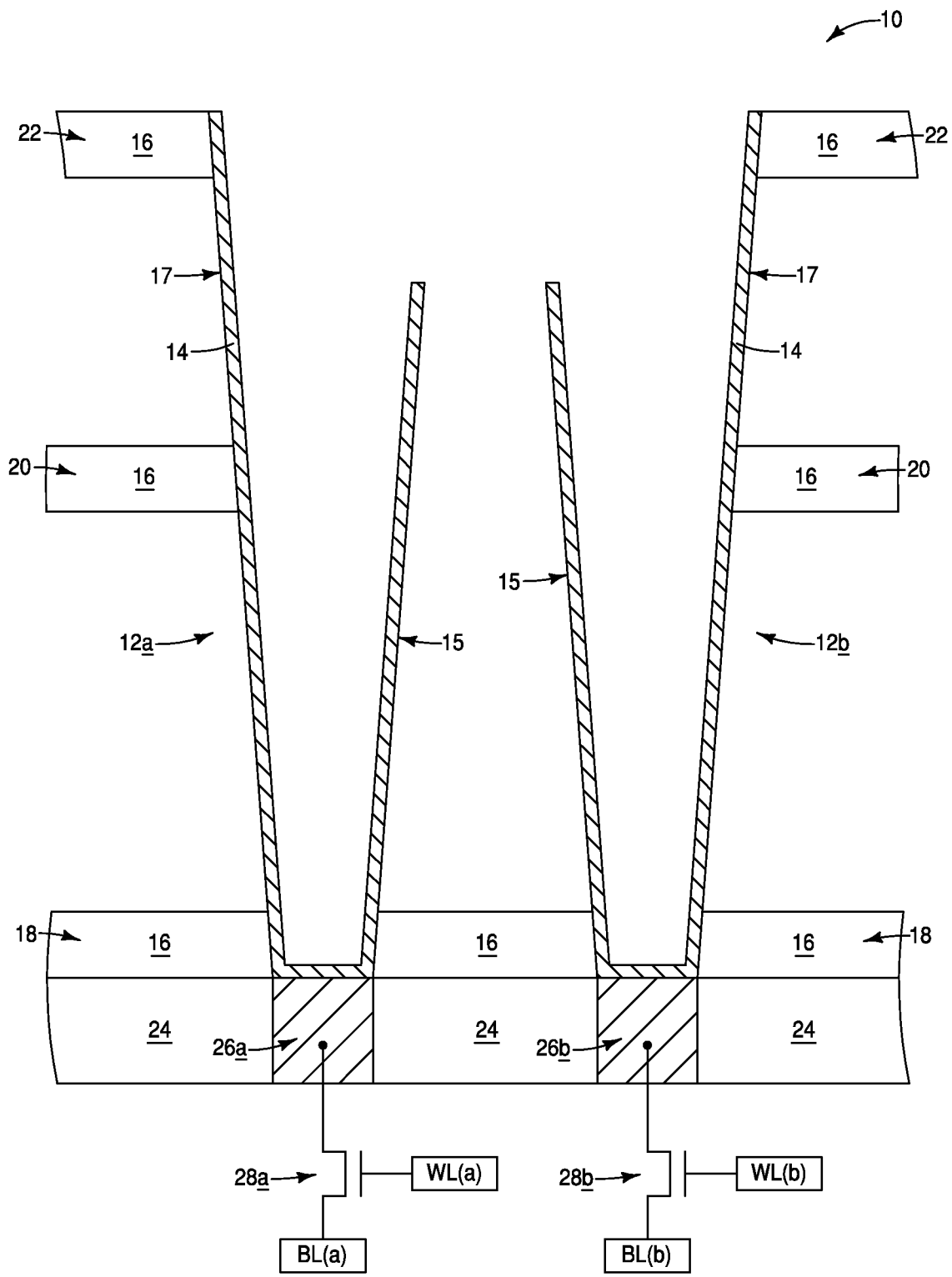
FIG. 1 is a diagrammatic cross-sectional side view of a prior art assembly having a pair of neighboring capacitor storage nodes.
Figure 2A:
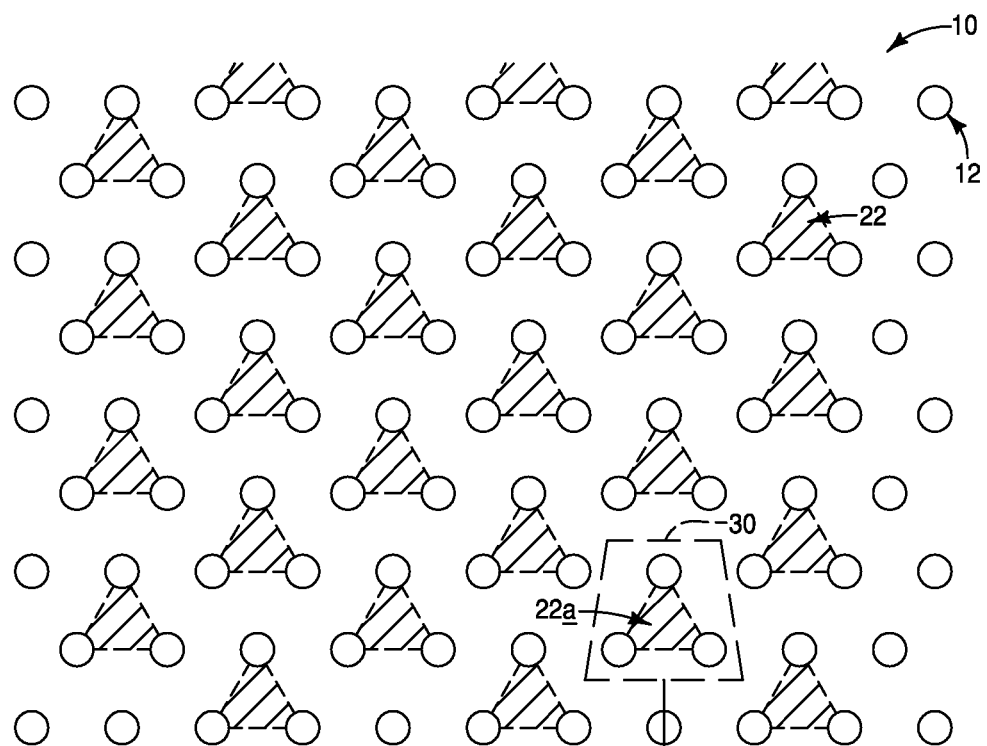
FIGS. 2A and 2B are diagrammatic top views of an example prior art top lattice arrangement (FIG. 2A) and an example prior art middle lattice arrangement (FIG. 2B) across a region comprising capacitor storage nodes of the type shown in FIG. 1.
Figure 2B:
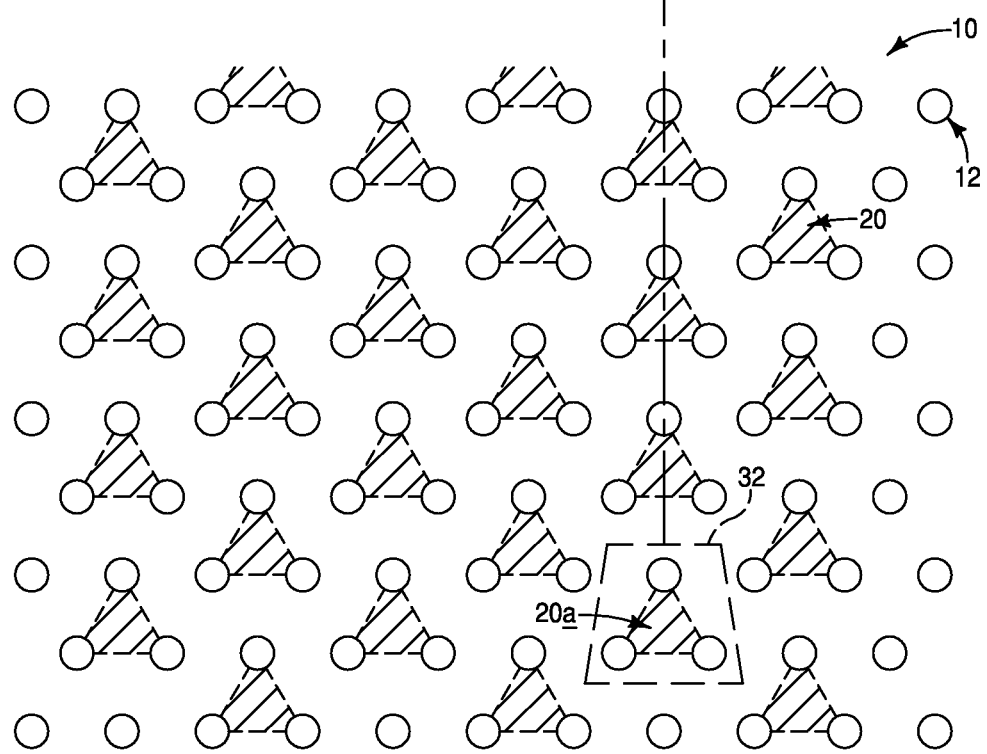
Figure 5:
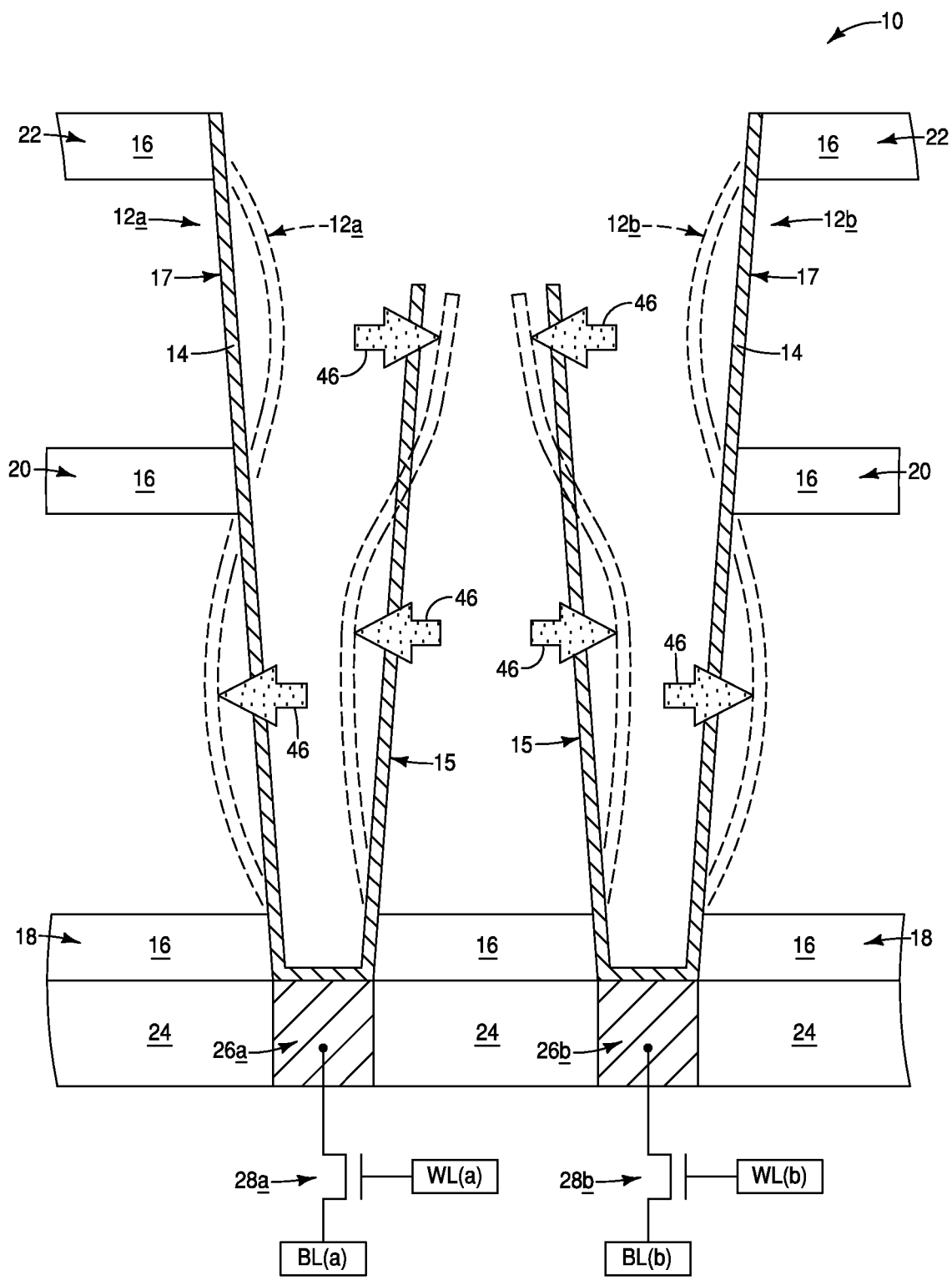
FIG. 5 is a diagrammatic cross-sectional side view of the prior art assembly of FIG. 1 illustrating potential problems that may occur with such assembly.

The embodiment of FIG. 6 may be advantageous relative to the prior art configuration of FIG. 1 in that the middle-level lattice 66 of the FIG. 6 configuration may provide improved support relative to the middle-level lattice 20 of the FIG. 1 configuration. Such may alleviate the problems described above with reference to FIG. 5.

Figure 3:
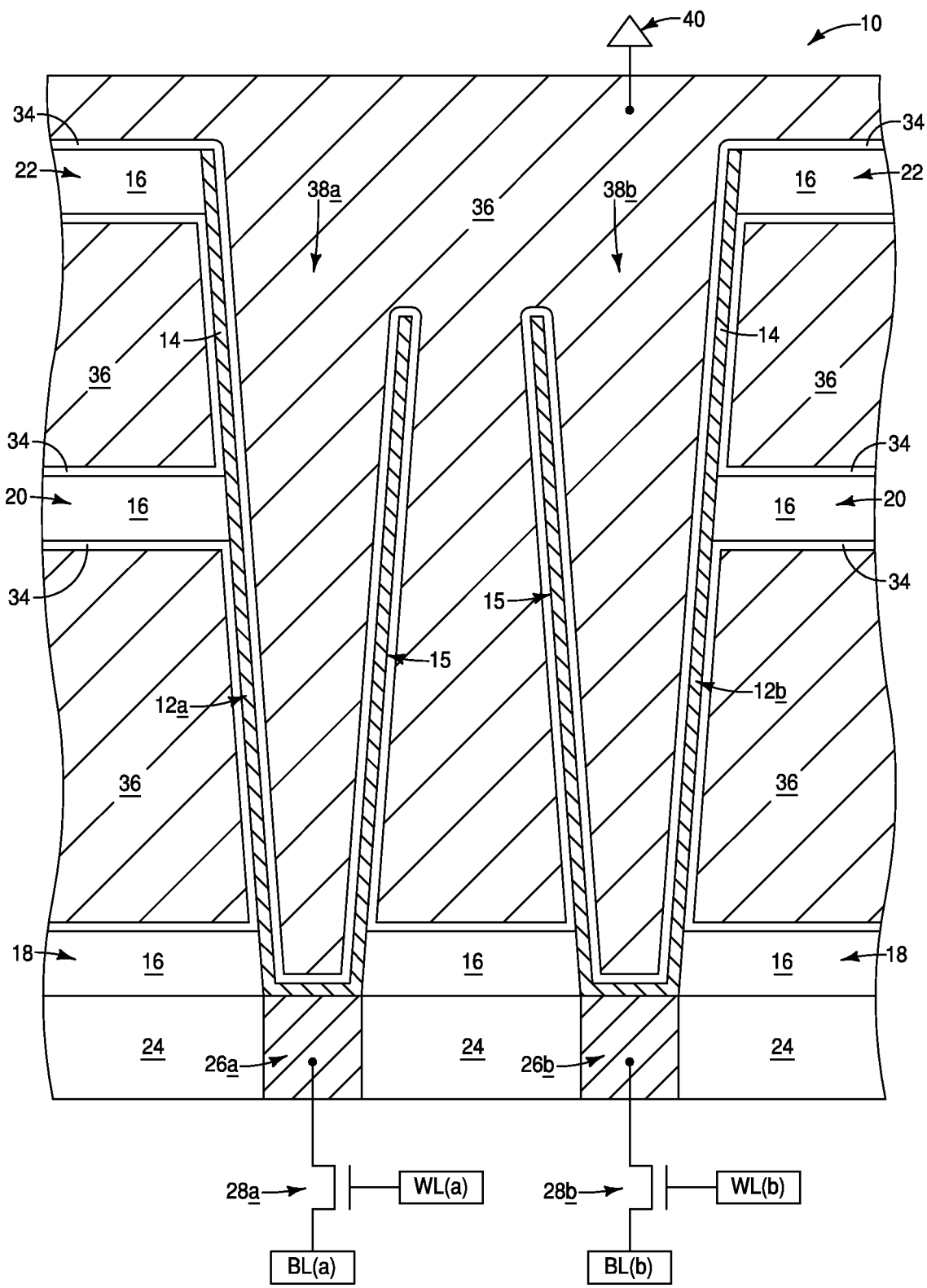
FIG. 3 is a diagrammatic cross-sectional side view of a prior art assembly having a pair of neighboring capacitors within an integrated memory.
Figure 7:
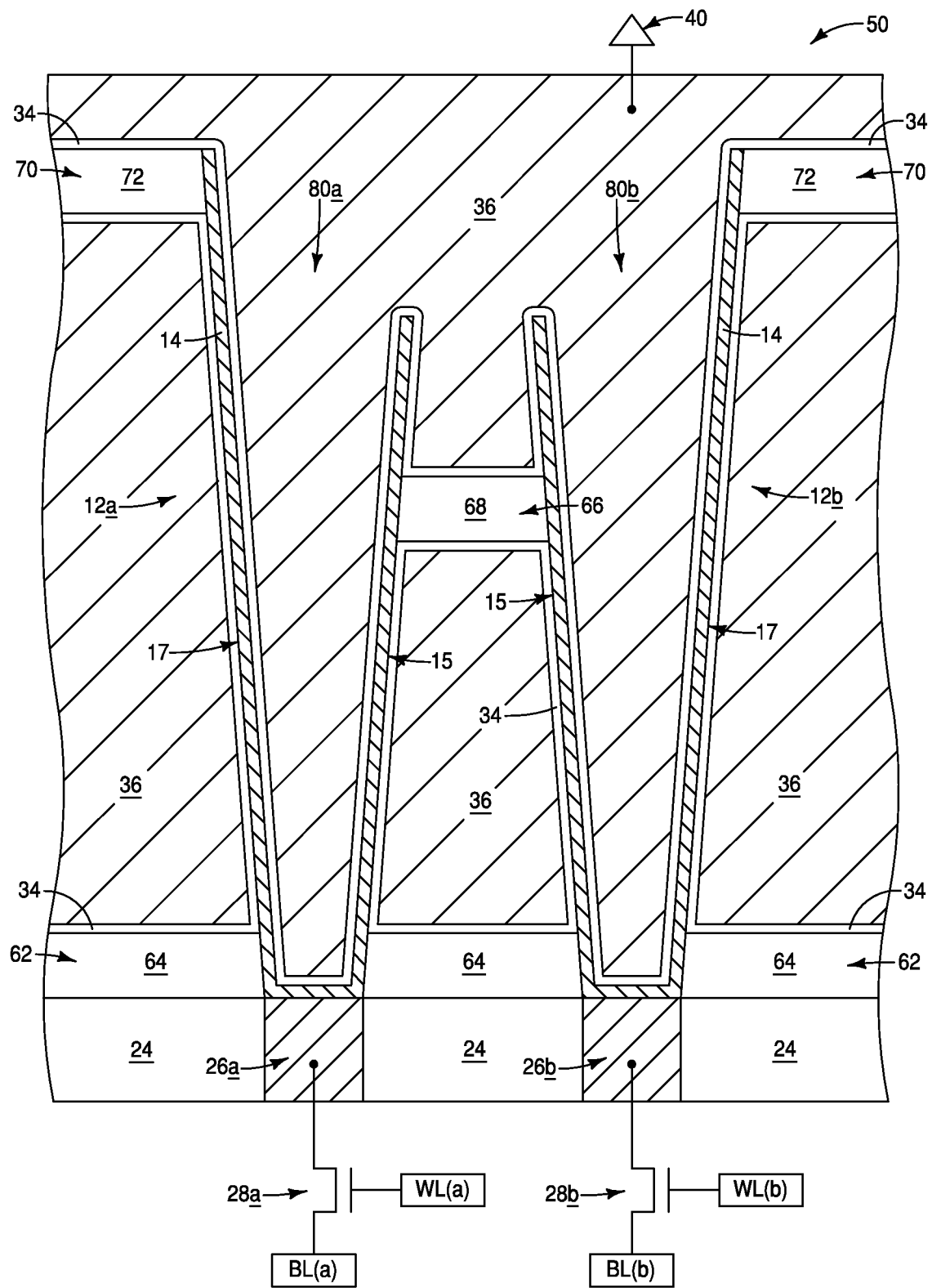
FIG. 7 is a diagrammatic cross-sectional side view of an example assembly having a pair of neighboring capacitors within an integrated memory.

The storage nodes 12a and 12b of FIG. 6 may be incorporated into capacitors. FIG. 7 shows the integrated assembly 50 after the capacitor dielectric material 34 and capacitor electrode material 36 are formed along the storage nodes 12a and 12b. The electrode material 36 forms a plate electrode, and such is coupled with the reference voltage 40 which was described above with reference to FIG. 3.

The capacitor dielectric material 34 may comprise any suitable composition(s); and in some embodiments may comprise silicon dioxide. The capacitor electrode material 36 may comprise any suitable composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the capacitor electrode material 36 may comprise metal. The capacitor electrode material 36 may comprise a same composition as the storage node material 14 in some embodiments, and may comprise a different composition relative to the storage node material 14 in other embodiments.

The storage node 12a, together with the capacitor dielectric material 34 and the capacitor electrode material 36, forms a first capacitor 80a; and the storage node 12b, together with the capacitor dielectric material 34 and the capacitor electrode material 36, forms a second capacitor 80b. In some embodiments, the capacitors 80a and 80b may be considered to be cylindrical capacitors, in that they comprise the cylindrically-shaped storage nodes 12a and 12b. The capacitors 80a and 80b may be considered to be generally representative of a group of substantially identical capacitors that may be referred to as capacitors 80.

Figure 4:
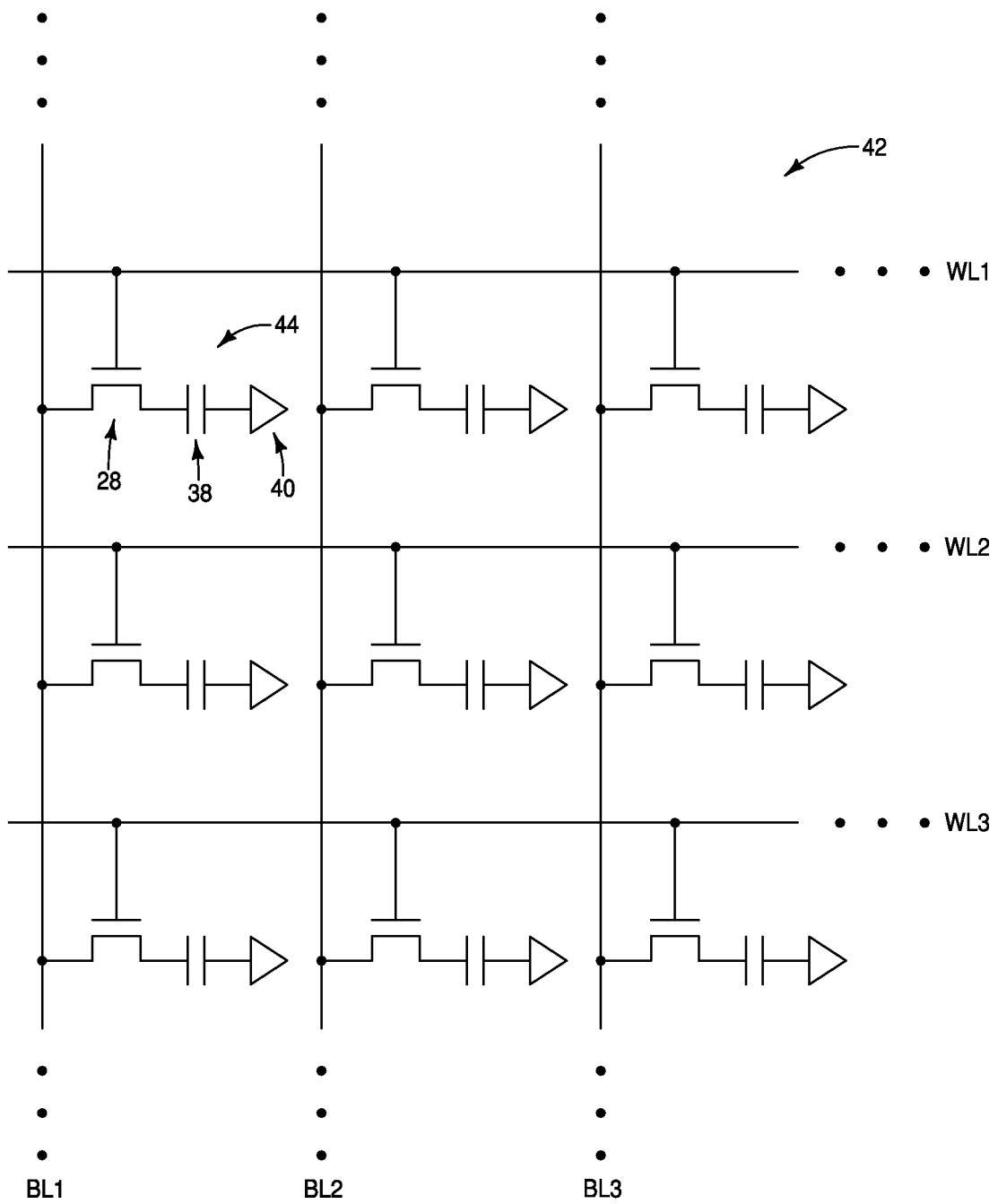
FIG. 4 is a schematic illustration of a prior art integrated memory.

The first and second capacitors 80a and 80b are neighboring capacitors, and are coupled with the transistors 28a and 28b, respectively. The capacitors 80a and 80b, together with the transistors 28a and 28b, may be incorporated into a memory array (e.g., a DRAM array) analogous to the memory array discussed above with reference to FIG. 4.

The storage nodes 12a and 12b of FIG. 6 may be formed with any suitable processing. For instance, FIGS. 8A and 8B show assembly 50 at process stages that may precede the process stage of FIG. 6 in some example embodiments.

Figure 8A:
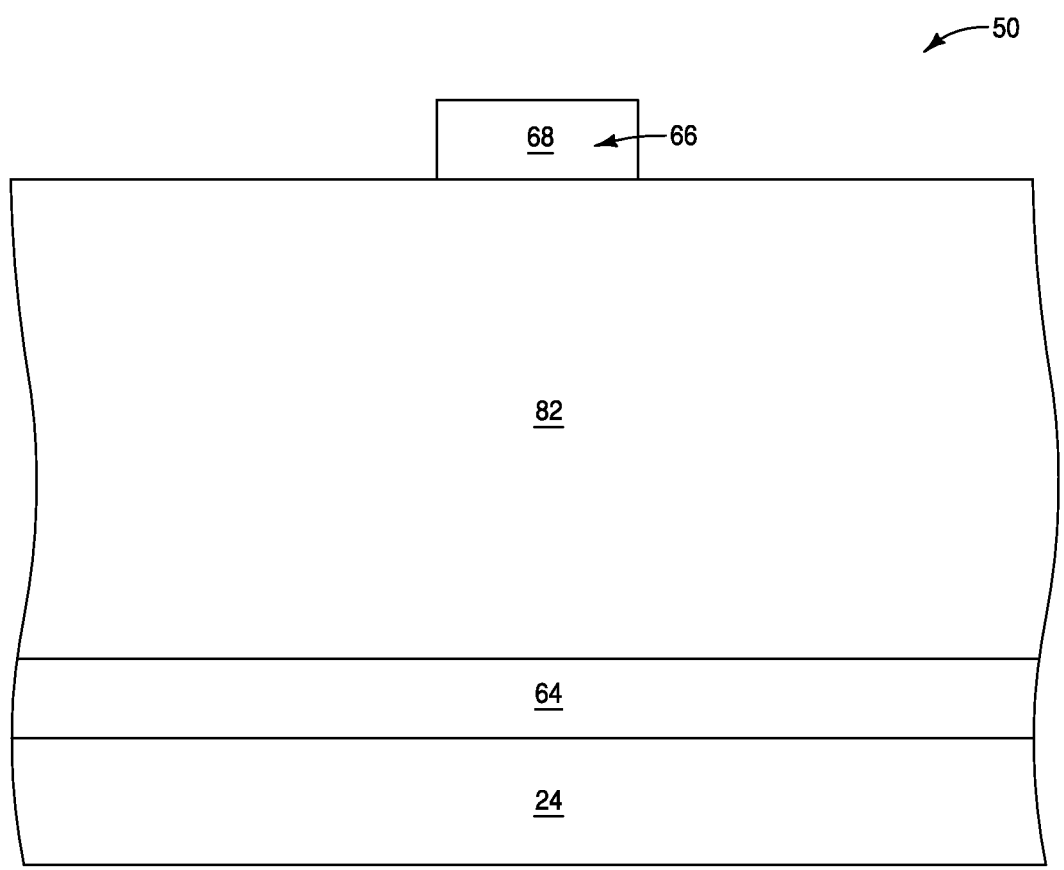
FIGS. 8A and 8B are diagrammatic cross-sectional side views of an example assembly at example process stages of an example method for fabricating the example assembly of FIG. 6.

The process stage of FIG. 8A shows the lattice material 64 formed over the material 24. The interconnects 26a and 26b, and the transistors 28*a* and 28*b* of FIG. 6 are not shown at the process stage of FIG. 8A; and may or may not be present.

An insulative mass (mold) 82 is formed over the lattice material 64, and the lattice material 68 is formed over the insulative mass 82. The lattice material 68 is patterned into the middle-level lattice 66.

Figure 8B:
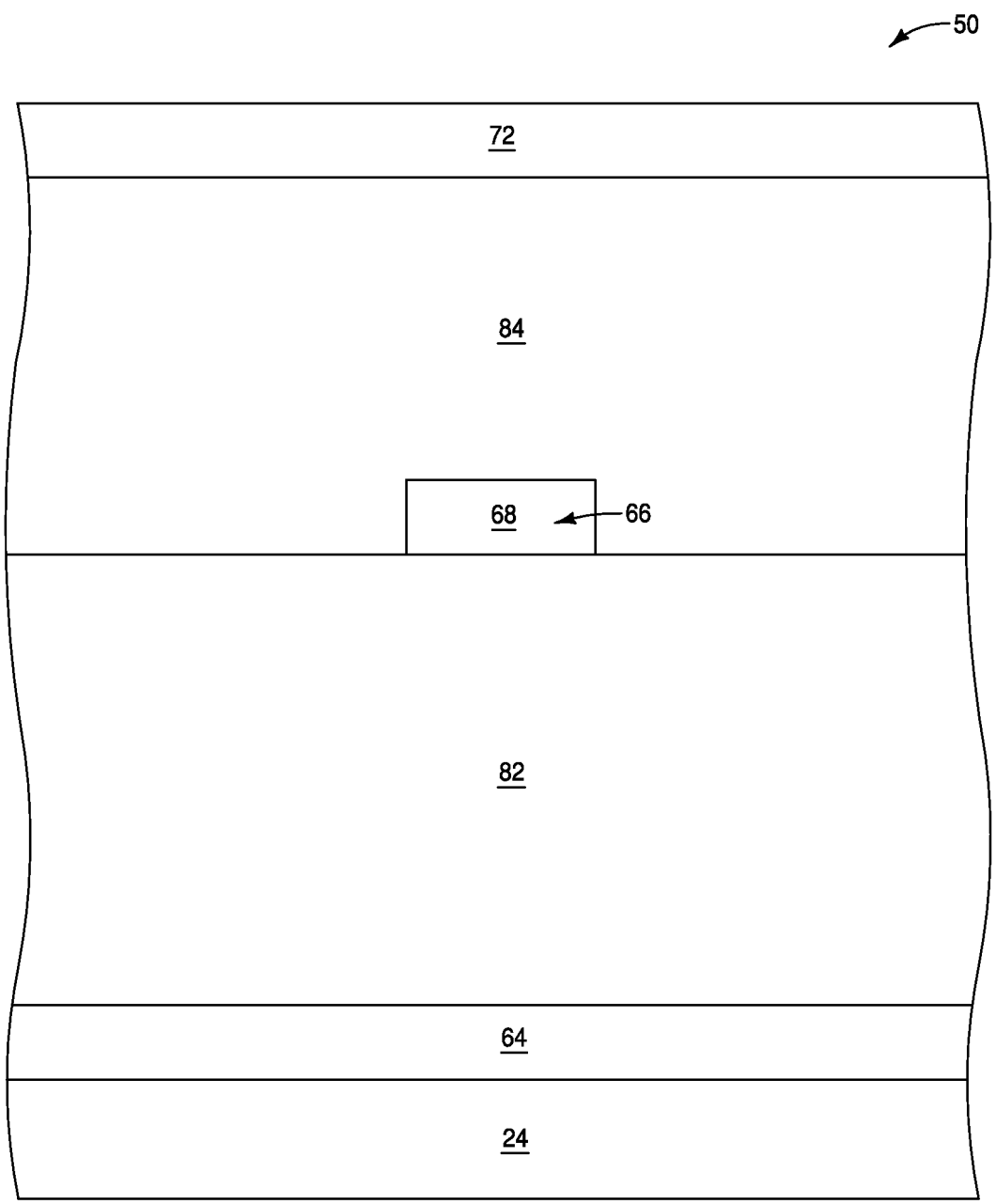

Referring to FIG. 8B, another insulative mass (mold) 84 is formed over the lattice material 68 and the insulative mass 82; and the lattice material 72 is formed over the insulative mass 84.

The insulative masses 82 and 84 may comprise a same composition as one another in some embodiments. The insulative masses 82 and 84 may comprise any suitable composition(s); and in some embodiments may comprise, consist essentially of, or consist of silicon dioxide.

Subsequent process stages may follow that of FIG. 8B to pattern openings through the materials 64, 82, 84 and 72; and form the storage node material 14 (FIG. 6) within such openings to thereby fabricate the storage nodes 12*a* and 12*b*. Remaining portions of the insulative masses 82 and 84 may be removed to leave the construction shown in FIG. 6.

The integrated assembly of FIG. 6 differs from the prior art assembly of FIG. 1 in that the assembly of FIG. 6 has the middle-level lattice 66 patterned differently than higher-level lattice 70. FIGS. 9-11 diagrammatically illustrate example patterning which may be utilized relative to the lattices 66 and 70 of FIG. 6.

Figure 9A:
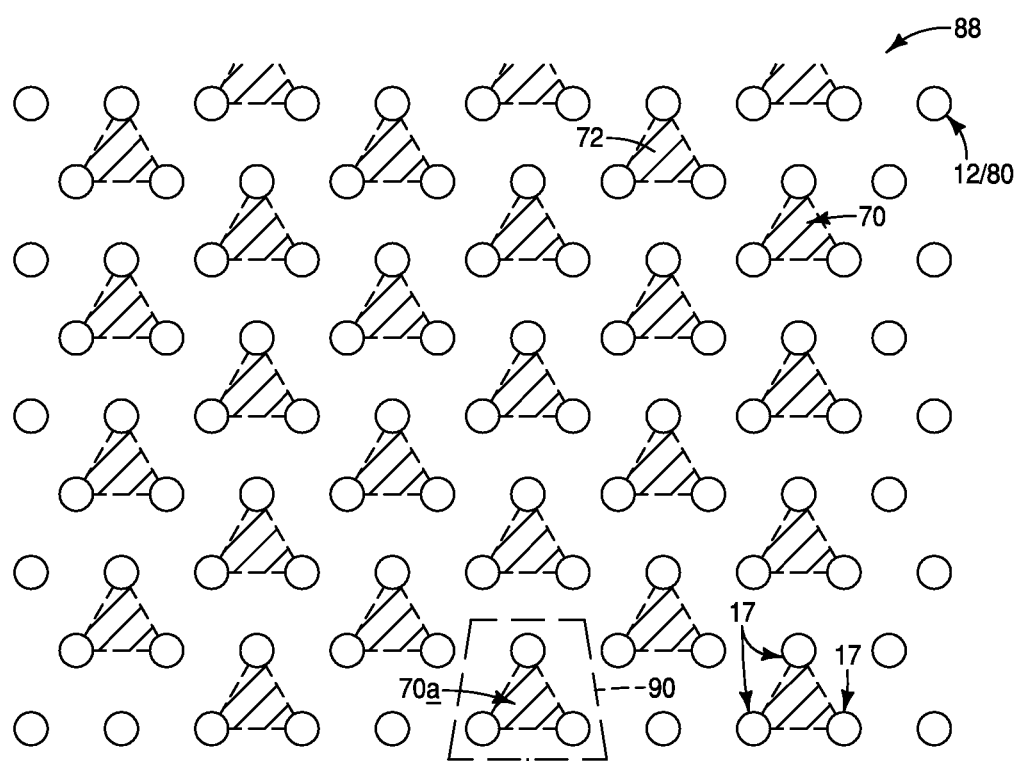
FIGS. 9A and 9B are diagrammatic top views of an example art top lattice arrangement (FIG. 9A) and an example middle lattice arrangement (FIG. 9B) across a region comprising capacitor storage nodes/capacitors of the types shown in FIGS. 6 and 7.
Figure 9B:
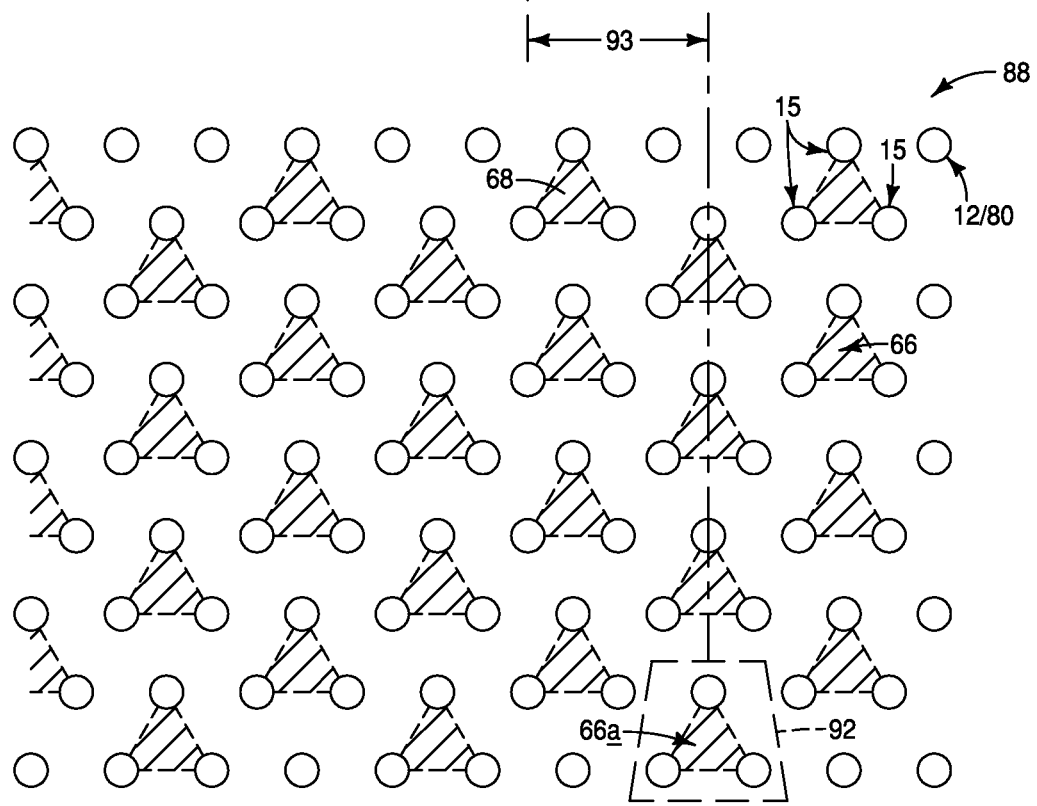

FIGS. 9A and 9B show a plurality of storage nodes 12 arranged in a hexagonally-packed pattern, with the storage nodes being incorporated into capacitors 80. The storage nodes/capacitors 12/80 are shown extending across a memory array 88.

The higher-level lattices 70 are shown in FIG. 9A, and the middle-level lattices 66 are shown in FIG. 9B. The storage nodes/capacitors (12/80) of FIGS. 9A and 9B are shown diagrammatically; with outer surfaces of the structures 12/80 representing the second edges 17 in FIG. 9A, and the outer surfaces of the structures 12/80 representing the first edges 15 in FIG. 9B.

One of the higher-level lattices 70 of FIG. 9A is labeled as a lattice 70*a* so that it may be specifically identified, and is surrounded with a box 90; and one of the middle-levels lattices 66 of FIG. 9B is labeled as a lattice 66*a* so that it may be specifically identified, and is surrounded with the box 92. The higher-level lattice 70*a* is patterned differently than the middle-level lattice 66*a*, and specifically is offset from the middle-level lattice 66*a* (as indicated by the offset 93).

In the embodiment of FIG. 9B, each of the middle-level lattices 66 is adjacent to the first side surfaces 15 of three of the storage nodes/capacitors 12/80. In some embodiments, the middle-level lattices 66 may comprise the material 68 directly contacting the first side surfaces 15 of the storage nodes/capacitors 12/80 (with an example of such direct contact being shown in FIG. 6). The embodiment of FIG. 9B may be considered to be representative of embodiments in which the middle-level lattices 66 are adjacent to first side surfaces 15 of at least three substantially identical storage nodes/capacitors 12/80.

Figure 10A:
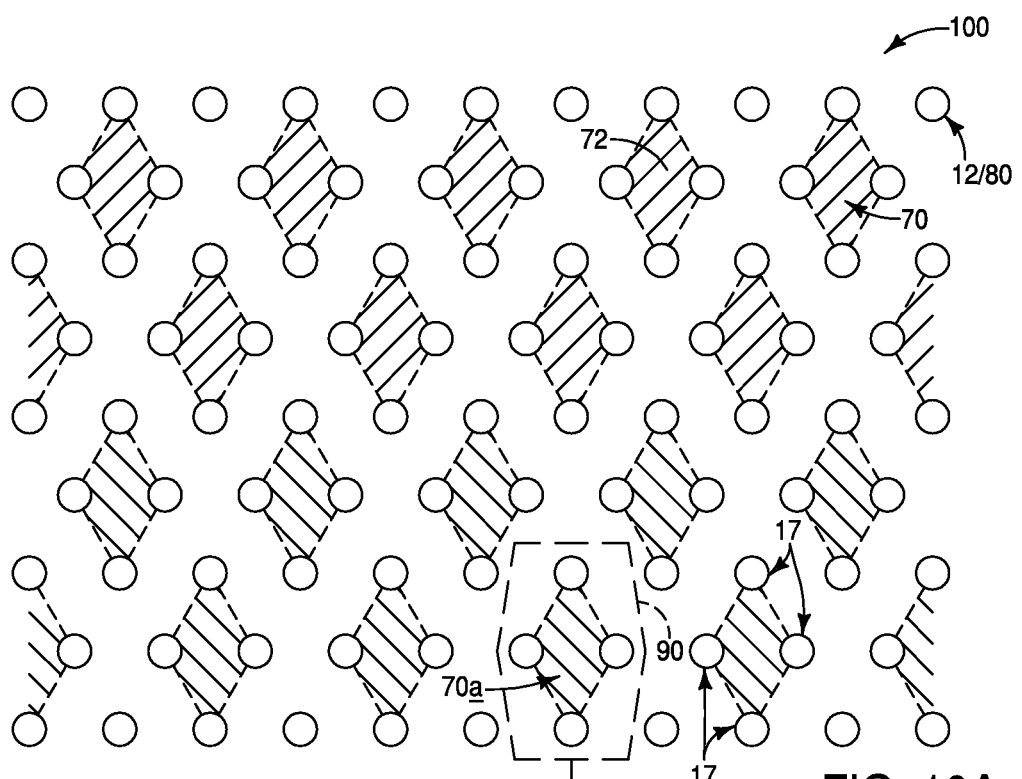
FIGS. 10A and 10B are diagrammatic top views of an example art top lattice arrangement (FIG. 10A) and an example middle lattice arrangement (FIG. 10B) across a region comprising capacitor storage nodes/capacitors of the types shown in FIGS. 6 and 7.
Figure 10B:
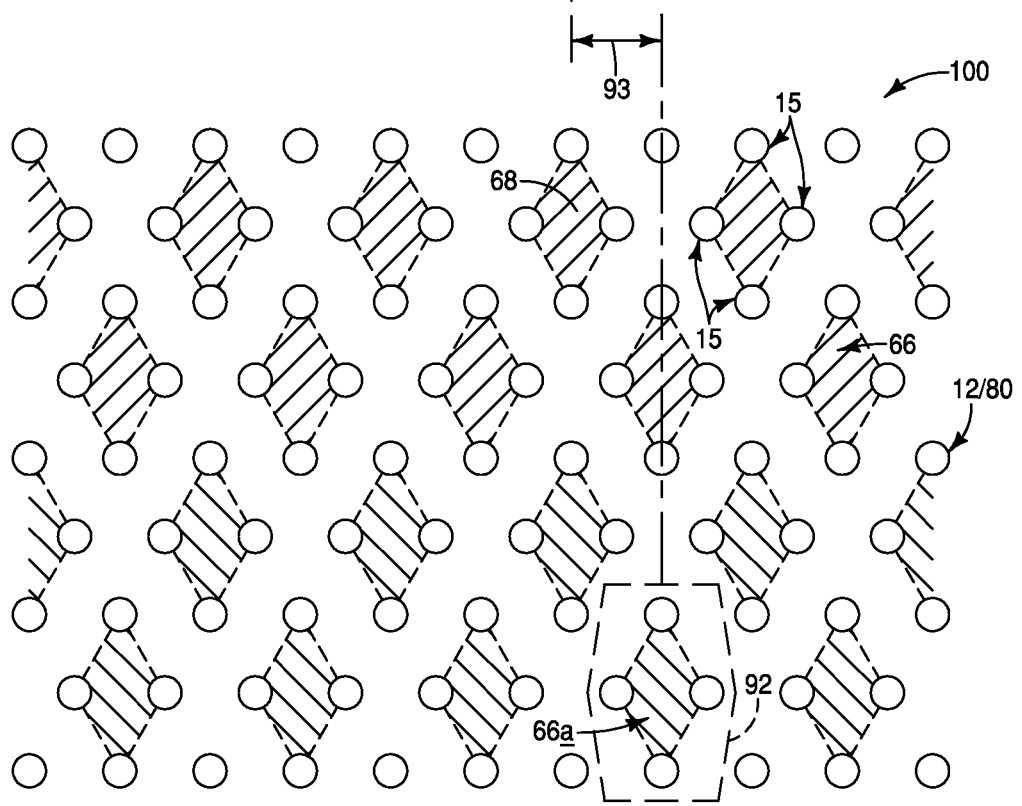

Referring to FIGS. 10A and 10B, such show the storage nodes/capacitors 12/80 arranged in a hexagonally-packed pattern across a memory array 100.

The higher-level lattices 70 are shown in FIG. 10A, and the middle-level lattices 66 are shown in FIG. 10B. The structures 12/80 are shown to comprise the second edges 17 in FIG. 10A, and to comprise the first edges 15 in FIG. 10B.

One of the higher-level lattices 70 of FIG. 10A is labeled as a lattice 70*a* so that it may be specifically identified, and is surrounded with a box 90; and one of the middle-levels lattices 66 of FIG. 10B is labeled as a lattice 66*a* so that it may be specifically identified, and is surrounded with the box 92. The higher-level lattice 70*a* is patterned differently than the middle-level lattice 66*a*, and specifically is offset from the middle-level lattice 66*a* (as indicated by the offset 93).

In the embodiment of FIG. 10B, each of the middle-level lattices 66 is adjacent to the first side surfaces 15 of four of the storage nodes/capacitors 12/80. In some embodiments, the middle-level lattices 66 may comprise the material 68 directly contacting the first side surfaces 15 of the storage nodes/capacitors 12/80 (with an example of such direct contact being shown in FIG. 6). The embodiment of FIG. 10B may be considered to be representative of embodiments in which the middle-level lattices 66 are adjacent to first side surfaces 15 of at least four substantially identical storage nodes/capacitors 12/80.

Figure 11A:
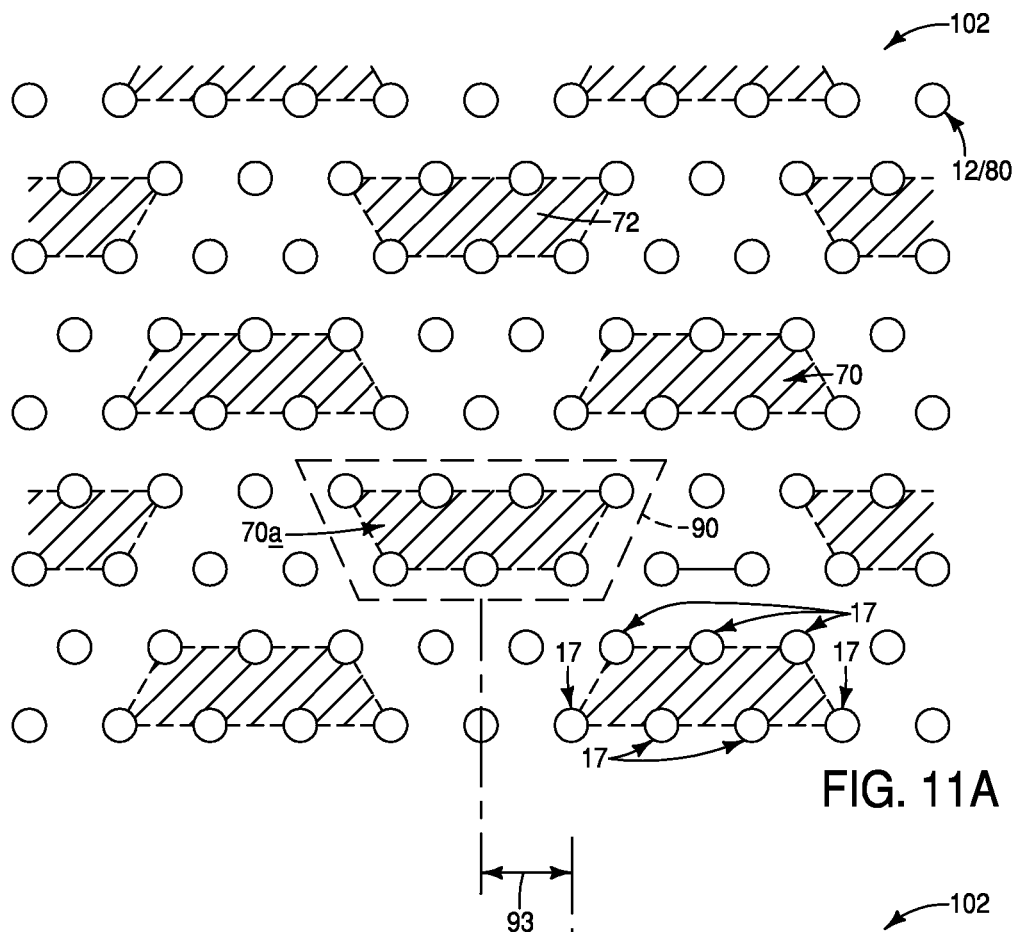
FIGS. 11A and 11B are diagrammatic top views of an example art top lattice arrangement (FIG. 11A) and an example middle lattice arrangement (FIG. 11B) across a region comprising capacitor storage nodes/capacitors of the types shown in FIGS. 6 and 7.
Figure 11B:
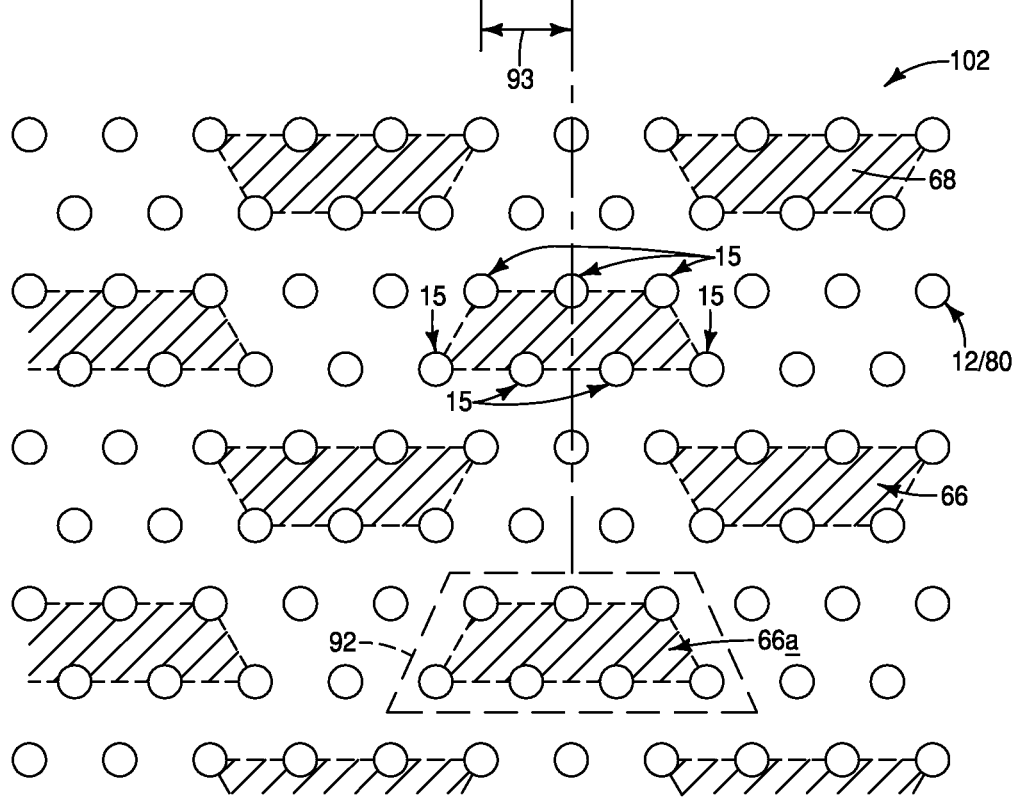

Referring to FIGS. 11A and 11B, such show the storage nodes/capacitors 12/80 arranged in a hexagonally-packed pattern across a memory array 102.

The higher-level lattices 70 are shown in FIG. 11A, and the middle-level lattices 66 are shown in FIG. 11B. The structures 12/80 are shown to comprise the second edges 17 in FIG. 11A, and to comprise the first edges 15 in FIG. 11B.

One of the higher-level lattices 70 of FIG. 11A is labeled as a lattice 70*a* so that it may be specifically identified, and is surrounded with a box 90; and one of the middle-levels lattices 66 of FIG. 11B is labeled as a lattice 66*a* so that it may be specifically identified, and is surrounded with the box 92. The higher-level lattice 70*a* is patterned differently than the middle-level lattice 66*a*, and specifically is offset from the middle-level lattice 66*a* (as indicated by the offset 93). Also, the higher-level lattice 70*a* is inverted relative to the middle-level lattice 66*a*.

In the embodiment of FIG. 11B, each of the middle-level lattices 66 is adjacent to the first side surfaces 15 of seven of the storage nodes/capacitors 12/80. In some embodiments, the middle-level lattices 66 may comprise the material 68 directly contacting the first side surfaces 15 of the storage nodes/capacitors 12/80 (with an example of such direct contact being shown in FIG. 6). The embodiment of FIG. 11B may be considered to be representative of embodiments in which the middle-level lattices 66 are adjacent to first side surfaces 15 of at least seven substantially identical storage nodes/capacitors 12/80.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties.

The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a capacitor. The capacitor has, along a cross-section, a storage node configured as an upwardly-opening container shape. The container shape has a first side surface and a second side surface. The first and second side surfaces are along outer edges of the container shape and are in opposing relation to one another. The second side surface has a lower portion vertically overlapped by the first side surface, and has an upper portion which is not vertically overlapped by the first side surface. A middle-level lattice is adjacent to the first side surface and supports the first side surface. A higher-level lattice is adjacent to the second side surface and supports the second side surface. The higher-level lattice is above the middle-level lattice.

Some embodiments include an integrated assembly having a pair of neighboring capacitors. One of the neighboring capacitors is a first capacitor and has a first storage node. The other of the neighboring capacitors is a second capacitor and has a second storage node. The first and second storage nodes together have a configuration, along a cross-section, of an outer pair of sidewalls and an inner pair of sidewalls. A first level is defined to extend along lower regions of the first and second storage nodes. A third level is defined to extend along upper regions of the first and second storage nodes. A second level is defined to be between the first and the third levels. An upper-level lattice is along the third level of the first and second storage nodes and on outer peripheries of the outer pair of sidewalls. A middle-level lattice is along the second level of the first and second storage nodes and between the inner pair of sidewalls.

Some embodiments include integrate memory having a pair of neighboring capacitors. One of the neighboring capacitors is a first capacitor and has a first storage. The other of the neighboring capacitors is a second capacitor and has a second storage node. The first and second storage nodes together have a configuration, along a cross-section, of an outer pair of sidewalls and an inner pair of sidewalls. The inner pair of sidewalls has upper surfaces which are recessed relative to upper surfaces of the outer pair of sidewalls. The first and second storage nodes have upper regions along the upper surfaces of the outer pair of sidewalls, have lower regions beneath the upper regions, and have middle regions between the upper regions and the lower regions. An upper-level lattice is along the upper regions of the first and second storage nodes and on outer peripheries of the outer pair of sidewalls. A middle-level lattice is along the middle regions of the first and second storage nodes and is between the inner pair of sidewalls. A first transistor is coupled with the first storage node. A second transistor is coupled with the second storage node.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   a plurality of individual capacitors, each individual capacitor having a storage node configured as an upwardly-opening container shape with external sidewall surfaces;
   a lattice having a repeating lattice pattern, the repeating lattice pattern comprising four lattice elements with each lattice element extending between and contacting the external sidewalls surface of two adjacent of the storage nodes, wherein each repeating lattice pattern connects storage nodes of four of the individual capacitors to form a supporting structure.

2. The integrated assembly of claim 1 wherein the storage node comprises conductive material and the lattice comprises insulative material.

3. The integrated assembly of claim 2 wherein the insulative material is silicon nitride.

4. The integrated assembly of claim 1 wherein the supporting structure has a shape along a horizontal cross section, the shape being more elongate in a first direction along the cross section relative to the shape along a second direction along the cross section.

5. The integrated assembly of claim 4 wherein the first and second directions are orthogonal relative to one another.

6. An integrated assembly comprising:
   a plurality of storage nodes, each of the storage nodes being configured as an upwardly open container over a supporting base that extends along a horizontal direction, the storage nodes having conductive outer edges; and
   a lattice material in direct physical contact with the conductive outer edges of the storage nodes and spaced from the supporting base by a distance, the lattice material being patterned into lattice portions with each portion extending between neighboring storage nodes to form a lattice pattern across a horizontal cross section, the lattice pattern having repeating units with each repeating unit including a group of four of the plurality of storage nodes and having a shape that is more elongate in a first direction along the horizontal cross section relative to the shape along a second direction along the horizontal cross section, the first and second directions being orthogonal relative to one another.

7. The integrated assembly of claim 6, wherein the lattice material is a first lattice material, wherein the distance is a first distance, and wherein the lattice pattern is a first lattice pattern having first repeating units including first groups of four storage nodes, and further comprising a second lattice material in direct physical contact with the conductive outer edges of the storage nodes and spaced from the supporting base by a second distance, the second lattice material being patterned into lattice portions with each portion extending between neighboring storage nodes to form a second lattice pattern across a second horizontal cross section, the second lattice pattern having second repeating units with each repeating unit including a second group of four of the plurality of storage nodes, the second group of four having a single of the storage nodes in common with any individual of the first repeating units.

8. The integrated assembly of claim 7 wherein the second repeating units each have a shape along the second horizontal cross section that is more elongate in the first direction relative to the shape along the second direction.

9. The integrated assembly of claim 7 wherein the first lattice material is present at a higher-level along the conductive outer edges than the second lattice material.

10. The integrated assembly of claim 7 wherein the first and second lattice materials are the same.

11. The integrated assembly of claim 10 wherein the first and second lattice materials comprise silicon nitride.

12. The integrated assembly of claim 6, wherein the conductive outer edges comprise one or more materials selected from the group consisting of Ti, Ni, W, Co, Pt, Ru, metal silicide, metal nitride, metal carbide, and conductively doped semiconductor material.

13. The integrated assembly of claim 12 wherein the conductive outer edges comprise titanium nitride.

14. The integrated assembly of claim 6, wherein each of the storage nodes is cylindrically shaped.

15. The integrated assembly of claim 6, further comprising:
a plurality of individual transistors, each of the individual transistors being coupled with an individual storage node comprised by the plurality of storage nodes.

* * * * *